United States Patent
Kang et al.

(10) Patent No.: US 7,521,718 B2
(45) Date of Patent: Apr. 21, 2009

(54) ORGANIC LIGHT EMITTING DISPLAY

(75) Inventors: Sun Kil Kang, Anyang-si (KR); Changnam Kim, Seoul (KR); Honggyu Kim, Urwang-si (KR); Sangkyoon Kim, Hanam-si (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 11/654,636

(22) Filed: Jan. 18, 2007

(65) Prior Publication Data

US 2007/0164294 A1  Jul. 19, 2007

(30) Foreign Application Priority Data

Jan. 19, 2006  (KR) .................. 10-2006-0006007

(51) Int. Cl.
*H01L 27/15* (2006.01)

(52) U.S. Cl. .................. 257/79; 257/72; 438/149; 438/153

(58) Field of Classification Search .................. 257/79, 257/59, 72; 438/149, 153, 257
See application file for complete search history.

(56) References Cited

U.S. PATENT DOCUMENTS

| | | | | |
|---|---|---|---|---|
| 5,814,836 A | * | 9/1998 | Hyun | .................. 257/72 |
| 6,849,877 B2 | * | 2/2005 | Yamazaki et al. | ............. 257/86 |
| 7,112,821 B2 | * | 9/2006 | Lee et al. | ....................... 257/79 |
| 7,277,148 B2 | * | 10/2007 | Kim et al. | .................... 349/138 |
| 7,314,785 B2 | * | 1/2008 | Yamazaki et al. | ........... 438/149 |
| 2001/0019133 A1 | * | 9/2001 | Konuma et al. | ................ 257/79 |
| 2003/0201447 A1 | * | 10/2003 | Yamazaki et al. | ............. 257/79 |
| 2004/0183072 A1 | * | 9/2004 | Kim et al. | ..................... 257/59 |
| 2004/0222429 A1 | * | 11/2004 | Yamazaki et al. | ............. 257/79 |
| 2005/0045891 A1 | * | 3/2005 | Yamazaki et al. | ............. 257/72 |
| 2005/0072973 A1 | * | 4/2005 | Kim | ............................. 257/59 |
| 2005/0230692 A1 | * | 10/2005 | Kim et al. | ..................... 257/79 |
| 2005/0285109 A1 | * | 12/2005 | Kim | ............................. 257/59 |
| 2006/0011914 A1 | * | 1/2006 | Kim et al. | ..................... 257/59 |
| 2006/0027817 A1 | * | 2/2006 | Yamazaki et al. | ............. 257/79 |
| 2006/0145161 A1 | * | 7/2006 | Lee et al. | ....................... 257/72 |

FOREIGN PATENT DOCUMENTS

KR   10-2006-0000363 A    1/2006

* cited by examiner

*Primary Examiner*—Matthew Smith
*Assistant Examiner*—Colleen E Rodgers
(74) *Attorney, Agent, or Firm*—KED & Associates LLP

(57) ABSTRACT

Provided is an organic light emitting display, comprising a substrate; a driving unit formed over the substrate; a planarization layer formed over the driving unit, the planarization layer comprising a normal tapered edge portion; and an emission unit formed over the planarization layer to be electrically connected to the driving unit.

30 Claims, 3 Drawing Sheets

ORGANIC LIGHT EMITTING DISPLAY

This nonprovisional application claims priority under 35 U.S.C. § 119(a) on Patent Application No. 10-2006-0006007 filed in Republic of Korea on Jan. 19, 2006 the entire contents of which are hereby incorporated by reference.

BACKGROUND

1. Field

The present invention relates to an organic light emitting display (OLED).

2. Related Art

In general, an organic light emitting display is a self-emitting display for emitting light by electrically exciting a fluorescent compound and has been spotlighted as a future generation display that can solve problems of a liquid crystal display as it can be driven in a low voltage, easily reduce a thickness, have a wide viewing angle and a fast response speed, etc.

The organic light emitting display comprises an organic emitting layer between an anode and a cathode. The organic light emitting display forms an exciton, which is a hole-electron pair, by coupling a hole received from the anode and an electron received from the cathode within the organic light emitting layer and emits light by generating energy when the exciton returns to a ground level. The organic light emitting display further comprises a hole (electron) injecting layer and/or a hole (electron) transporting layer between the anode or the cathode and the emitting layer.

Depending on a driving mode, an OLED is usually classified into a passive matrix organic light emitting display (PMOLED) and an active matrix organic light emitting display (AMOLED).

FIG. 1 illustrates a conventional OLED 100.

Referring FIG. 1, a driving unit 130 is formed over a substrate 100 and a planarization layer 150 is formed on the driving unit.

The driving unit 130 comprises at least a thin film transistor for driving. The thin film transistor comprises a gate electrode 131, a gate insulation layer 132, an active layer 133 made of amorphous silicon, an ohmic contact layer 134, a source electrode 135 and a drain electrode 136.

An emission unit 140 is formed on the planarization layer 150 to be connected to the driving unit 130. The emission unit 140 comprises a first electrode 141 connected to the drain electrode 136, an organic emitting layer 143 and a second electrode 144.

An insulating layer 142 is formed on the first electrode 141 exposing a portion of the first electrode 141. The organic emitting layer 143 is formed on the exposed portion of the first electrode 141.

A passivation layer 160 is formed on the emission unit 140 to cover the emission unit 140 and the planarization layer 150. A cover substrate 120 is attached to the substrate 110 comprising the passivation layer 160. The substrate 110 and the cover substrate 120 are attached with a sealant 170.

Moisture and oxygen penetrating inside the OLED may damage the organic emitting layer and the electrodes. More specifically, moisture passes into a pin hole formed in a portion of a cathode or into an edge portion between the cathode and a barrier rib, and reacts with organic layer and the electrodes, thereby generating hydrogen.

Such hydrogen diffuses to the left and right sides on an interface between the cathode and the organic emitting layer, causing generation of bubbles over the organic emitting layer. As a result, an event in which the cathode is lifted up occurs frequently. Also, when oxygen transmits through the pin hole of the cathode or the edge portions between the cathode and a barrier rib, an oxide layer is likely to be formed on the cathode at the interface between the cathode and the organic emitting layer. This oxide layer often shields a flow of current.

In the above described conventional OLED 100, the passivation layer 160 is formed to protect the driving unit 130 and the emission unit 140. Particularly, an edge portion of the passivation layer 160 is formed to be inclined inwardly. In other words, the passivation layer comprises a normal tapered edge portion. However, since an edge portion of the planarization layer 150 are formed to have corners nearly perpendicular, the passivation layer 160 is not well deposited on the edge portions of the planarization layer 150. As a result, adhesion between the planarization layer 150 and the passivation layer generally becomes poor.

Accordingly, the driving unit 130 and the emission unit 140 may not be effectively protected by the passivation layer 160, because moisture and oxygen are more likely to penetrate into the devices from the outside through the passivation layer 160

SUMMARY

Accordingly, the present invention is provided an organic light emitting display, comprising a substrate; a driving unit formed over the substrate; a planarization layer formed over the driving unit, the planarization layer comprising a normal tapered edge portion; and an emission unit formed over the planarization layer to be electrically connected to the driving unit.

A taper angle of the edge portion of the planarization layer may be 15 degrees to 60 degrees.

The planarization layer may comprise one selected from a group consisting of a poly acryl-based resin, a polyimide-based resin, and a benzocyclobutene-based resin.

The organic light emitting display further comprises a passivation layer covering the emission unit and the planarization layer.

The passivation layer comprises a normal tapered edge portion.

A taper angle of the edge portion of the passivation layer is substantially the same as a taper angle of the edge portion of the planarization layer.

The organic light emitting display further comprises a cover substrate attached to the substrate with a sealant.

The sealant comprises a normal tapered edge portion.

Detailed features and advantages of the present invention will be fully described in the foregoing embodiments of the present invention and accompanying drawings.

BRIEF DESCRIPTION OF THE DRAWINGS

The accompanying drawings, which are comprised to provide a further understanding of the invention and are incorporated in and constitute a part of this specification, illustrate embodiments of the invention and together with the description serve to explain the principles of the invention. In the drawings.

DESCRIPTION OF EMBODIMENTS

Various embodiments of an organic light emitting display (OLED) according to the present invention will be described in a more detailed manner with reference to the attached drawings.

Figure 1:
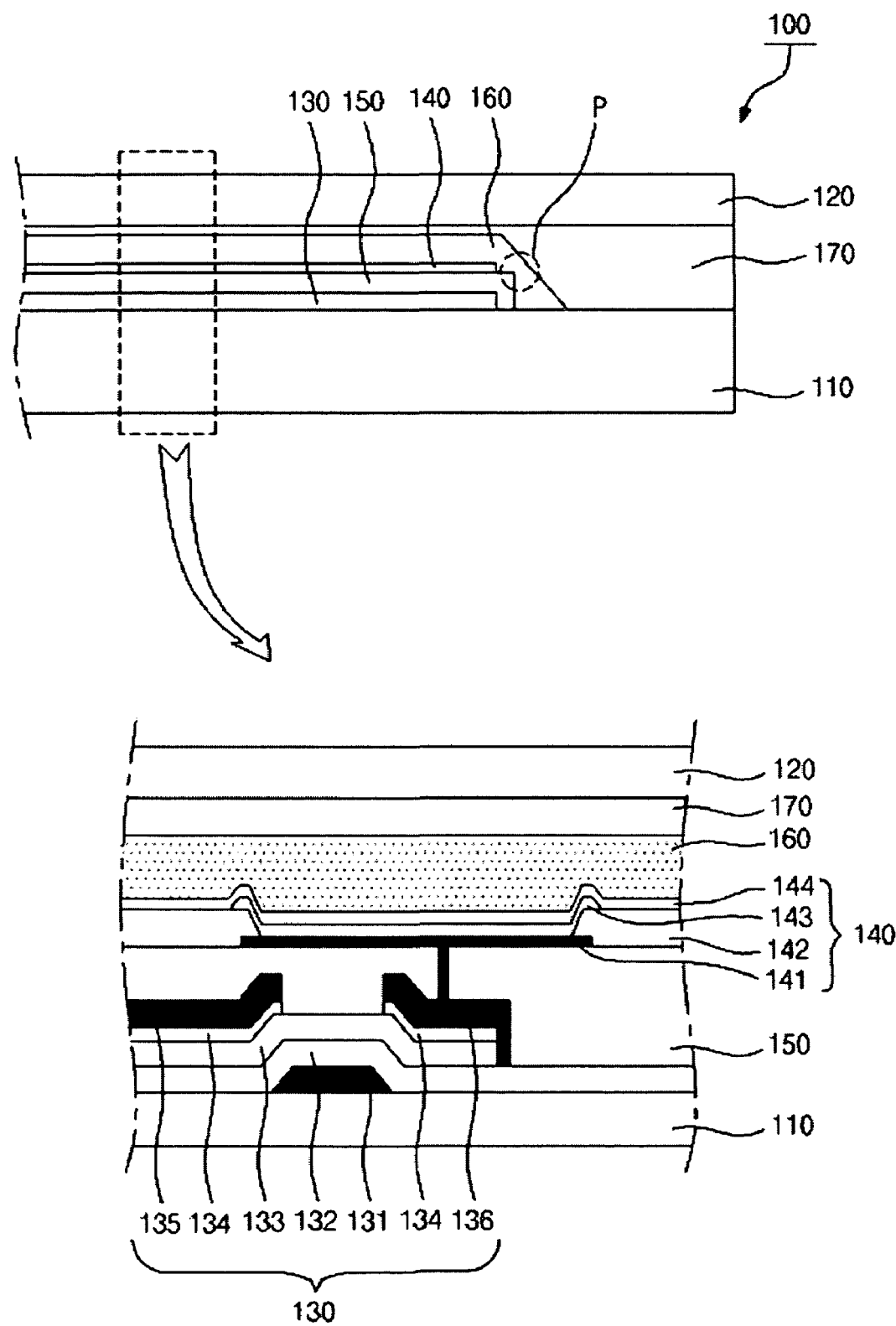
FIG. 1 illustrates a conventional organic light emitting display (OLED)
Figure 2:
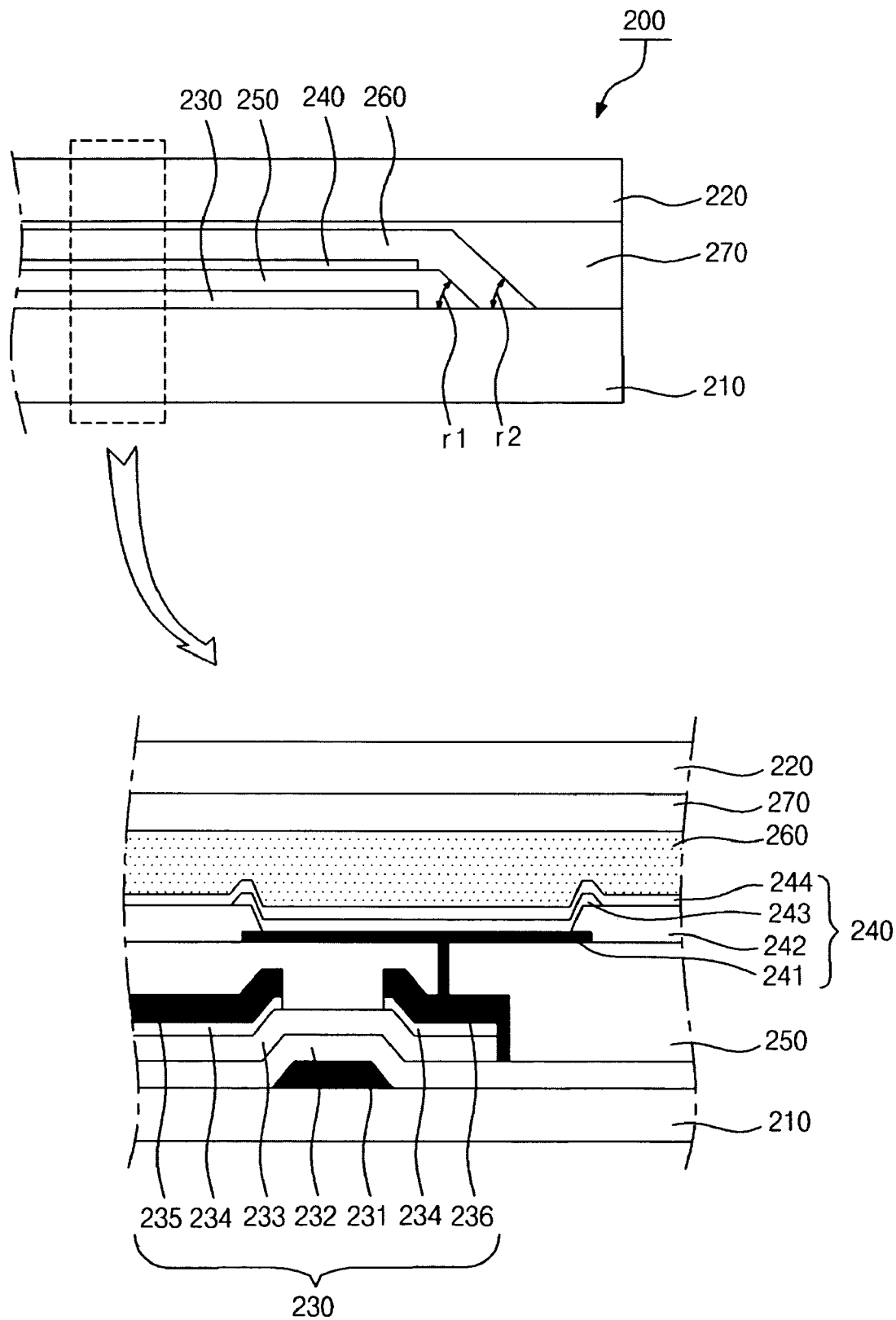
FIG. 2 illustrates an organic light emitting display (OLED) according to an embodiment of the present invention.

FIG. 2 illustrates an OLED 200 according to an embodiment of the present invention.

Referring to FIG. 2, a driving unit 230 and an emission unit 240 are formed over a substrate 210.

The driving unit 230 comprises at least a thin film transistor for driving. The thin film transistor comprises a gate electrode 231 formed over a substrate 210, a gate insulation layer 132 formed over a substrate 210 comprising a gate electrode 231. An active layer 233 made of amorphous silicon is formed over the gate insulation layer 132 to correspond to the gate electrode 231. An ohmic contact layer 234 is formed over on both sides of the active layer 233 the gate 231. A source 235 and a drain 236 are formed over respective portions of the ohmic contact layer 234.

Although not shown, the driving unit 230 further comprises a thin film transistor for switching and a capacitor.

A planarization layer 250 is formed over the substrate 210 comprising the driving unit 230 to obviate the height difference of the substrate 210 comprising the driving unit 230.

The planarization layer 250 may include an organic material. For instance, the planarization layer 250 includes one selected from a group consisting of a polyacryl-based resin, a polyimide-based resin, and a benzocyclobutene (BCB)-based resin.

On the other hand, the planarization layer 250 may include an inorganic material. For instance, the planarization layer 250 includes SOG (spin on glass).

The planarization layer 250 may comprise a normal tapered edge portion. A taper angle r1 of the edge portion of the planarization layer 250 may be about 15 degrees to 60 degrees. Preferably, a taper angle r1 of the edge portion of the planarization layer 250 may be about 15 degrees to 30 degrees.

When the planarization layer 250 comprises a photosensitive material, the edge portion of the planarization layer 250 is formed to be inclined inwardly by exposure. When the planarization layer 250 comprises a non-photosensitive material, the edge portion of the planarization layer 250 is formed to be inclined inwardly by dry etching.

A contact hole 245 is formed in the planarization layer 250 to expose a portion of the drain electrode 236, an emission unit 240 is formed over the planarization layer 250.

The emission unit 240 comprises a first electrode 241 connected to the drain electrode 236 through the contact hole 245, an organic emitting layer 243 and a second electrode 244.

When an OLED according to an embodiment of the present invention is top-emission type, the first electrode 241 may be an anode comprising a metal layer and a transparent conductive oxide layer having a high work function. The transparent conductive oxide layer comprises one selected from a group consisting of ITO, IZO, ICO and ZnO. The second electrode 244 may be a cathode and transflective electrode comprising a metal having a low work function. The metal comprises one selected from a group consisting of Mg, Ag, Al, Ca and alloy thereof.

On the other hand, the first electrode 241 may be a cathode comprising a metal having a low work function, and the second electrode 244 may be an anode comprising a transparent conductive oxide layer having a high work function.

An insulating layer 242 is formed on the first electrode 241 to expose a portion of the first electrode 241. The organic emitting layer 243 is formed on the exposed portion of the first electrode 241.

Although not shown, a hole injection layer (HIL) and/or a hole transport layer (HTL) may be formed between the first electrode 241 and the organic emitting layer 243, an electron transport layer (ETL) and/or an electron injection layer (EIL) may be formed on the organic emitting layer 243.

A passivation layer 260 is formed over the substrate 210 to cover the emission unit 240 and the planarization layer 250. The passivation layer 260 may comprise silicon nitride, silicon oxide or multiple layers comprising silicon nitride and/or silicon oxide. The passivation layer 260 is formed by sputtering or CVD (chemical vapor deposition).

The passivation layer 260 comprises a normal tapered edge portion. A taper angle r2 of the edge portion of the passivation layer 260 may be about 15 degrees to 60 degrees. Preferably, a taper angle r2 of the edge portion of the passivation layer 260 may be about 15 degrees to 30 degrees.

A taper angle r2 of the edge portion of the passivation layer 260 is substantially the same as a taper angle r1 of the edge portion of the planarization layer 250. When the taper angles r1 is substantially the same as the taper angle r2, step coverage characteristic of the passivation layer 260 and adhesion between the passivation layer 260 and the planarization layer 250 may improve so that the passivation layer 260 formed on the edge portion of the planarization layer 250 has a high degree of thickness uniformity.

On the other hand, a taper angle r2 of the edge portion of the passivation layer 260 is not the same as a taper angle r1 of the edge portion of the planarization layer 250. For example, a taper angle r2 of the edge portion of the passivation layer 260 is less than a taper angle r1 of the edge portion of the planarization layer 250. In this case, the thickness of the passivation layer formed on the edge portion of the planarization layer 250 is gradually increased toward the substrate 210, it may effectively block penetration of moisture or oxygen by covering the contact area of the planarization layer 250 and the substrate.

A cover substrate 220 is attached to the substrate 210 comprising the passivation layer 260 with a sealant 270. The cover substrate 220 may be a transparent substrate comprising glass or plastic.

As described above, the organic light emitting display according to an embodiment of the present invention comprises the planarization layer 250 having a normal tapered edge portion. And because a taper angle of the passivation layer 260 is substantially the same as that of the planarization layer, a contact area between the planarization layer 250 and the passivation layer 260 increases. This increase in contact area improves adhesion between the planarization layer 250 and the passivation layer 260, and thus, those undesired effects, often caused by the penetration of moisture or oxygen inside the devices, can be minimized.

Figure 3:
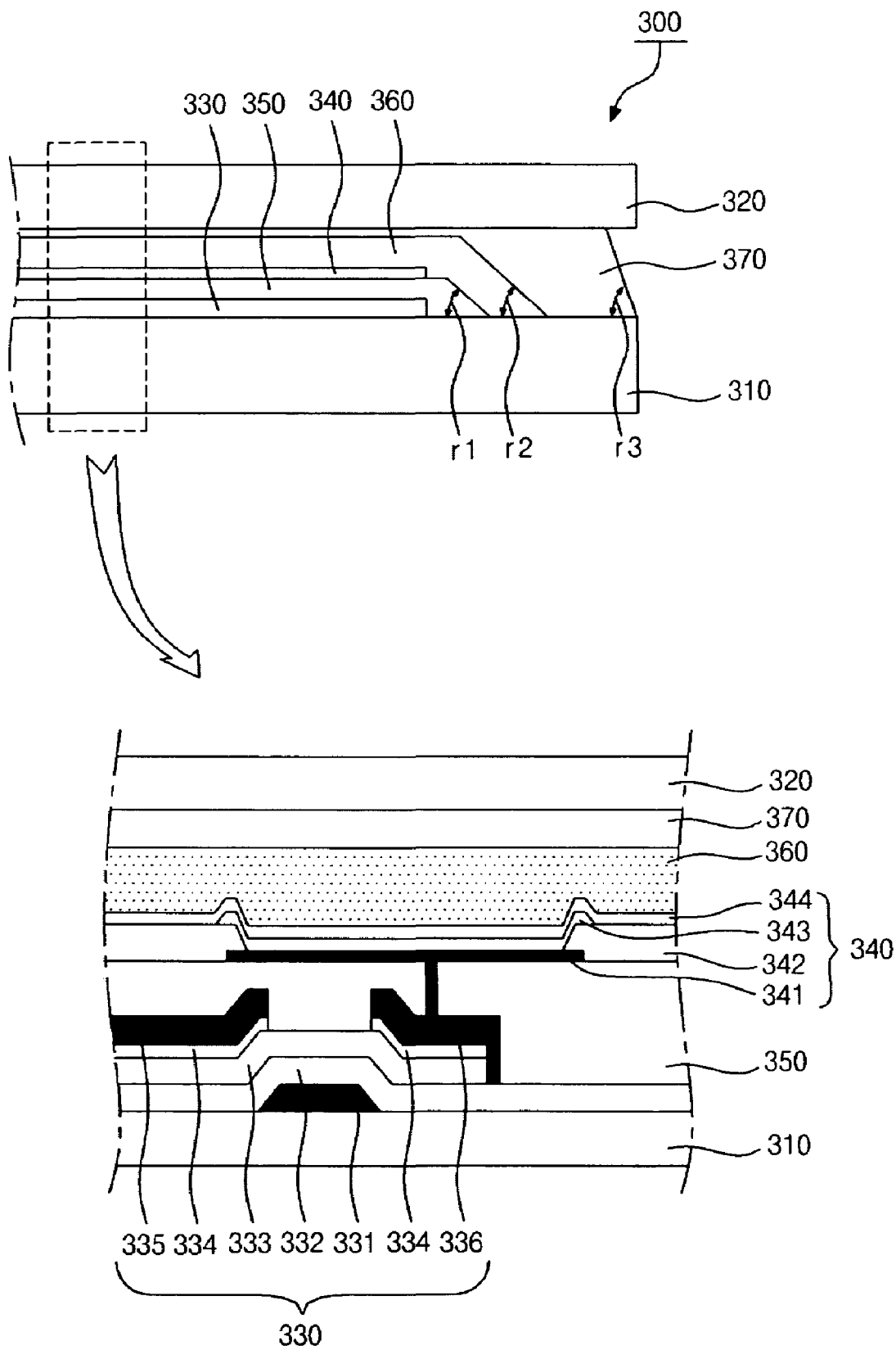
FIG. 3 illustrates an organic light emitting display (OLED) according to another embodiment of the present invention.

FIG. 3 illustrates an OLED according to another embodiment of the present invention.

Referring to FIG. 3, an OLED according to another embodiment of the present invention comprises a driving unit 330, a planarization layer 350 formed on the driving unit 330 and am emitting unit 340 formed on the planarization layer 350 to be connected to the driving unit 330. The planarization layer 350 may comprises a normal tapered edge portion.

The driving unit 330 comprises at least a thin film transistor for driving, the thin film transistor comprises a gate electrode 331, a gate insulation layer 332, an active layer 333 made of amorphous silicon, an ohmic contact layer 334, a source electrode 335 and a drain electrode 336. The emission unit 340 comprises a first electrode 341 connected to the drain electrode 336, an organic emitting layer 343 and a second electrode 344.

A passivation layer 360 is formed over the substrate 310 to cover the emission unit 340 and the planarization layer 350. Also, the passivation layer 360 comprises a normal tapered edge portion, a taper angle r2 of the edge portion of the passivation layer 360 is substantially the same as a taper angle r1 of the edge portion of the planarization layer 350.

A cover substrate 320 is attached to the substrate 310 comprising the passivation layer 360 with a sealant 370. When an OLED according to another embodiment of the present invention is top-emission type, the sealant 370 may be a face sealant which is located on a space between the cover substrate 320 and the substrate 310 comprising the passivation layer 360. Or, the sealant 370 may be an edge sealant which is located on an edge area between the cover substrate 320 and the substrate 310.

The sealant 370 may comprise a normal tapered edge portion, it may improve adhesion between the sealant 370 and the passivation layer 360.

Although it is illustrated in FIG. 3 that a taper angle r3 of the edge portions portion of the sealant 370 does not coincide with the taper angle r1 of the planarization layer 350 and the taper angle r2 of the passivation layer 360, the edge portion of the sealant 370 may be inclined to a certain degree of angle.

According to embodiments of the present invention, the edge portion of the planarization layer is formed to be inclined inwardly, the edge portion of the passivation layer is formed to be inclined to an angle substantially the same as the inclination angle of the planarization layer. Thus, adhesion between the edge portions of the planarization layer and the passivation layer can be improved, and thus, penetration of moisture or oxygen can be blocked.

The invention being thus described, it will be obvious that the same may be varied in many ways. Such variations are not to be regarded as a departure from the spirit and scope of the invention and all such modifications as would be obvious to one skilled in the art are intended to be included within the scope of the following claims.

What is claimed is:

1. An organic light emitting display comprising:
a substrate;
a driving unit formed over the substrate;
a planarization layer formed over the driving unit, the planarization layer comprising a normal tapered edge portion;
an emission unit formed over the planarization layer to be electrically connected to the driving unit; and
a passivation layer formed over the planarization layer to cover the emission unit and the planarization layer,
wherein the tapered edge portion of the planarization layer is in contact with the passivation layer.

2. The organic light emitting display of claim 1, wherein a taper angle of the edge portion of the planarization layer is about 15 degrees to 60 degrees.

3. The organic light emitting display of claim 1, wherein a taper angle of the edge portion of the planarization layer is about 15 degrees to 30 degrees.

4. The organic light emitting display of claim 1, wherein the planarization layer comprises one selected from a group consisting of a poly acryl-based resin, a polyimide-based resin, a benzocyclobutene-based resin, and a spin on glass (SOG).

5. The organic light emitting display of claim 1, wherein the passivation layer comprises a normal tapered edge portion, wherein a taper angle of the edge portion of the passivation layer is about 15 degrees to 60 degrees.

6. The organic light emitting display of claim 5, wherein the taper angle of the edge portion of the passivation layer is about 15 degrees to 30 degrees.

7. The organic light emitting display of claim 5, wherein a taper angle of the edge portion of the passivation layer is substantially the same as a taper angle of the edge portion of the planarization layer.

8. The organic light emitting display of claim 5, wherein a taper angle of the edge portion of the passivation layer is less than a taper angle of the edge portion of the planarization layer.

9. The organic light emitting display of claim 1, wherein the driving unit comprises at least a thin film transistor, wherein the thin film transistor comprises an active layer comprising amorphous silicon.

10. The organic light emitting display of claim 1, wherein the emission unit comprises a first electrode, an organic emitting layer and a second electrode.

11. The organic light emitting display of claim 10, wherein the first electrode is an anode comprising a metal layer and a transparent conductive oxide layer having a high work function.

12. The organic light emitting display of claim 11, wherein the transparent oxide layer comprises one selected from a group consisting of ITO, IZO, ICO and ZnO.

13. The organic light emitting display of claim 11, wherein the second electrode is a cathode and a transflective electrode comprising a metal having a low work function.

14. The organic light emitting display of claim 13, wherein the metal comprises one selected from a group consisting of Mg, Ag, Al, Ca and an alloy thereof.

15. The organic light emitting display of claim 10, wherein the first electrode is a cathode comprising a metal having a low work function.

16. The organic light emitting display of claim 15, wherein the second electrode is an anode comprising a transparent conductive oxide layer having a high work function.

17. The organic light emitting display of claim 1, further comprising a cover substrate attached to the substrate with a sealant.

18. The organic light emitting display of claim 17, wherein the cover substrate is a transparent substrate comprising glass or plastic.

19. The organic light emitting display of claim 17, wherein the sealant comprises a normal tapered edge portion.

20. The organic light emitting display of claim 1, wherein the tapered edge portion of the planarization layer contacts an area separated from the emission unit.

21. The organic light emitting display of claim 20, wherein the tapered edge portion of the planarization layer is located at a terminal end of the planarization layer that is not in contact with the emission unit.

22. The organic light emitting display of claim 1, wherein the tapered edge portion of the planarization layer slants away from the driving unit.

23. The organic light emitting display of claim 1, wherein the passivation layer has a tapered edge portion that contacts the tapered edge portion of the planarization layer.

24. The organic light emitting display of claim 23, wherein the edge portions of the passivation layer and the planarization layer taper at substantially the same angle.

25. The organic light emitting display of claim 23, wherein the edge portions of the passivation layer and the planarization layer taper at different angles.

26. The organic light emitting display of claim 1, further comprising:
- a sealant formed over the passivation and planarization layers,
  - wherein the sealant has an edge portion that tapers at a different angle than the tapered edge portions of the passivation and planarization layers.

27. The organic light emitting display of claim 1, wherein the tapered edge portion of the planarization layer is located between terminal ends of a cover substrate and a base substrate, the emission unit located between the cover and base substrates.

28. The organic light emitting display of claim 1, wherein the tapered edge portion of the planarization layer is located between an end of an electrode of the emission unit and a barrier rib.

29. An organic light emitting display comprising:
- a substrate;
- a driving unit on the substrate;
- a planarization layer, on the driving unit, having a tapered edge portion;
- an emission unit on the planarization layer to electrically couple with the driving unit; and
- a passivation layer on the planarization layer to cover the emission unit and the planarization layer,
- wherein the tapered edge portion of the planarization layer contacts the passivation layer.

30. The organic light emitting display of claim 29, wherein a taper angle of the edge portion of the planarization layer is approximately 15 degrees to 60 degrees.

* * * * *